United States Patent
Zhou et al.

(10) Patent No.: US 12,362,761 B2
(45) Date of Patent: Jul. 15, 2025

(54) DIGITAL-TO-ANALOG CONVERTER (DAC) WITH DYNAMIC STACKED CASCODE SWITCHES

(71) Applicant: QUALCOMM Incorporated, San Diego, CA (US)

(72) Inventors: Xiahan Zhou, San Diego, CA (US); Haibo Fei, San Diego, CA (US); Nitz Saputra, Burlingame, CA (US); Andrew Weil, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 212 days.

(21) Appl. No.: 18/338,708

(22) Filed: Jun. 21, 2023

(65) Prior Publication Data
US 2024/0429937 A1   Dec. 26, 2024

(51) Int. Cl.
*H03M 1/74* (2006.01)

(52) U.S. Cl.
CPC ................... *H03M 1/74* (2013.01)

(58) Field of Classification Search
CPC ....... H03M 3/74; H03M 3/742; H03M 3/0614
See application file for complete search history.

(56) References Cited

U.S. PATENT DOCUMENTS

| | | | | |
|---|---|---|---|---|
| 6,407,688 B1* | 6/2002 | Greig | ................... | H03M 1/0604 323/315 |
| 6,583,744 B2* | 6/2003 | Bright | ................. | H03M 1/0604 341/145 |
| 6,927,714 B1* | 8/2005 | Teterwak | ............ | H03M 1/0604 341/144 |
| 7,161,412 B1* | 1/2007 | Manganaro | ......... | H03M 1/1057 327/543 |
| 7,202,744 B1* | 4/2007 | Manganaro | ............. | H03F 1/303 330/296 |
| 7,283,082 B1* | 10/2007 | Kuyel | ................... | H03M 1/682 341/145 |
| 8,653,999 B1* | 2/2014 | Verlinden | ............. | H03M 1/662 341/150 |

(Continued)

OTHER PUBLICATIONS

International Search Report and Written Opinion—PCT/US2024/030608—ISA/EPO—Oct. 25, 2024.

(Continued)

*Primary Examiner* — Lam T Mai
(74) *Attorney, Agent, or Firm* — Patterson & Sheridan LLP

(57) ABSTRACT

Certain aspects of the present disclosure generally relate to a digital-to-analog converter (DAC) circuit implemented with a dynamic stacked transistor architecture. The DAC circuit generally includes a first current-steering transistor and a second current-steering transistor. The DAC circuit may also include: a first stacked transistor coupled between the first current-steering transistor and a first output of the DAC circuit; a first switch coupled between a gate of the first stacked transistor and a bias voltage node; a second switch coupled between the gate of the first stacked transistor and a voltage rail; a second stacked transistor coupled between the second current-steering transistor and a second output of the DAC circuit; a third switch coupled between a gate of the second stacked transistor and the bias voltage node; and a fourth switch coupled between the gate of the second stacked transistor and the voltage rail.

20 Claims, 9 Drawing Sheets

(56) References Cited

U.S. PATENT DOCUMENTS

| | | | |
|---|---|---|---|
| 8,674,867 B1* | 3/2014 | Klepser | H01F 21/12 375/295 |
| 9,148,160 B2* | 9/2015 | Zhu | H04B 15/02 |
| 9,548,752 B1* | 1/2017 | Shrivastava | H03M 1/66 |
| 9,806,729 B1* | 10/2017 | Razzaghi | H03M 1/0612 |
| 9,871,531 B1* | 1/2018 | Fang | H03M 1/68 |
| 10,461,768 B1* | 10/2019 | Dong | H03M 1/0881 |
| 10,469,097 B1* | 11/2019 | Bothra | H03F 3/45183 |
| 10,944,417 B1* | 3/2021 | Lahiri | H03M 1/742 |
| 11,265,001 B1* | 3/2022 | Lahiri | H03M 1/0863 |
| 11,271,576 B1* | 3/2022 | Weil | H03M 1/1009 |
| 11,394,393 B1* | 7/2022 | Lahiri | H03M 1/661 |
| 11,990,916 B2* | 5/2024 | Agrawal | H03M 1/0863 |
| 2002/0030621 A1 | 3/2002 | Okada et al. | |
| 2002/0113723 A1* | 8/2002 | Greig | H03M 1/0604 341/136 |
| 2013/0063292 A1* | 3/2013 | Ginetti | H03K 3/356026 341/136 |
| 2013/0342378 A1* | 12/2013 | Ward | H03M 1/0617 341/144 |
| 2014/0146913 A1* | 5/2014 | Kuttner | H04B 1/04 375/295 |
| 2014/0146914 A1* | 5/2014 | Kuttner | H03M 1/66 375/295 |
| 2014/0266824 A1* | 9/2014 | Lowney | H03M 1/1009 341/120 |
| 2015/0061910 A1* | 3/2015 | Zele | H03M 1/66 341/144 |
| 2018/0081386 A1* | 3/2018 | Draxelmayr | G05F 3/267 |
| 2021/0036711 A1* | 2/2021 | Yang | H03M 1/687 |
| 2021/0159907 A1* | 5/2021 | Singh | H03M 1/1033 |
| 2022/0263469 A1* | 8/2022 | Ayranci | H03F 1/0205 |
| 2022/0416804 A1* | 12/2022 | Mehdizad Taleie | H03M 1/466 |
| 2023/0024327 A1* | 1/2023 | Zhou | H03M 1/745 |
| 2023/0403022 A1* | 12/2023 | Zhou | H03M 1/1042 |
| 2024/0014824 A1* | 1/2024 | Ramprasad | H03M 1/08 |
| 2024/0223147 A1* | 7/2024 | Chee | H03F 1/223 |
| 2024/0275378 A1* | 8/2024 | Dabag | H03K 17/56 |
| 2024/0421828 A1* | 12/2024 | Fei | H03M 1/68 |

OTHER PUBLICATIONS

Lin C-H., et al., "A 12 bit 2.9 GS/s DAC With IM3 60 dBc Beyond 1 GHz in 65 nm CMOS," IEEE Journal of Solid-State Circuits, vol. 44, No. 12, Dec. 1999, XP011285552, Dec. 1, 2009, XP011285552, pp. 3285-3293, ISSN: 0018-9200, DOI: 10.1109/JSSC.2009.2032624 Section IV, Section V, figures 6-9.

* cited by examiner

DIGITAL-TO-ANALOG CONVERTER (DAC) WITH DYNAMIC STACKED CASCODE SWITCHES

BACKGROUND

Field of the Disclosure

Certain aspects of the present disclosure generally relate to electronic components and, more particularly, to circuitry for digital-to-analog conversion.

Description of Related Art

Electronic devices include computing devices such as desktop computers, notebook computers, tablet computers, smartphones, wearable devices like a smartwatch, internet servers, and so forth. These various electronic devices provide information, entertainment, social interaction, security, safety, productivity, transportation, manufacturing, and other services to human users. These various electronic devices depend on wireless communications for many of their functions. Wireless communication systems and devices are widely deployed to provide various types of communication content such as voice, video, packet data, messaging, broadcast, and so on. These systems may be capable of supporting communication with multiple users by sharing the available system resources (e.g., time, frequency, and power). Examples of such systems include code division multiple access (CDMA) systems, time division multiple access (TDMA) systems, frequency division multiple access (FDMA) systems, and orthogonal frequency division multiple access (OFDMA) systems (e.g., a Long Term Evolution (LTE) system or a New Radio (NR) system). Wireless devices may include transmitters for processing signals for transmission via antennas. A transmitter may include one or more digital-to-analog converters (DACs) configured to convert signals from the digital domain to the analog domain for further processing (e.g., upconversion, filtering, and amplification) prior to transmission.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description," one will understand how the features of this disclosure provide the advantages described herein.

Certain aspects of the present disclosure are directed towards a digital-to-analog converter (DAC) circuit. The DAC circuit generally includes: a first current-steering transistor coupled to a current-steering node; a second current-steering transistor coupled to a current-steering node; a first stacked transistor coupled between the first current-steering transistor and a first output of the DAC circuit; a first switch coupled between a gate of the first stacked transistor and a bias voltage node; a second switch coupled between the gate of the first stacked transistor and a voltage rail; a second stacked transistor coupled between the second current-steering transistor and a second output of the DAC circuit; a third switch coupled between a gate of the second stacked transistor and the bias voltage node; and a fourth switch coupled between the gate of the second stacked transistor and the voltage rail.

Certain aspects of the present disclosure are directed towards a DAC circuit. The DAC circuit generally includes: a first current-steering transistor coupled to a current-steering node; a second current-steering transistor coupled to a current-steering node; a first stacked transistor coupled between the first current-steering transistor and a first output of the DAC circuit, wherein the first stacked transistor is configured to be turned off based on the first current-steering transistor being turned off; and a second stacked transistor coupled between the second current-steering transistor and a second output of the DAC circuit, wherein the second stacked transistor is configured to be turned off based on the first current-steering transistor being turned off.

Certain aspects of the present disclosure are directed towards a method for digital-to-analog conversion. The method generally includes: receiving an input signal at a gate of a first current-steering transistor coupled to a current-steering node; receiving a complementary input signal at a gate of a second current-steering transistor coupled to a current-steering node; controlling a first stacked transistor coupled between the first current-steering transistor and a first output of the DAC circuit, wherein the first stacked transistor is turned off based on the first current-steering transistor being turned off; and controlling a second stacked transistor coupled between the second current-steering transistor and a second output of the DAC circuit, wherein the second stacked transistor is turned off based on the first current-steering transistor being turned off.

To the accomplishment of the foregoing and related ends, the one or more aspects comprise the features hereinafter fully described and particularly pointed out in the claims. The following description and the appended drawings set forth in detail certain illustrative features of the one or more aspects. These features are indicative, however, of but a few of the various ways in which the principles of various aspects may be employed.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Certain aspects of the present disclosure generally relate to techniques for digital-to-analog conversion implemented with a dynamic stacked transistor architecture. For example, certain aspects provide a digital-to-analog converter (DAC) implemented with current steering. The current-steering DAC may include stacked transistors coupled in cascode with respective current-steering switches. Also referred to as "cascode transistors," the stacked transistors reduce a dependency of the DAC performance on load impedance. However, the inclusion of the stacked transistors may result in distortions due to the data-dependently charging and discharging of parasitic capacitance at nodes between the stacked transistors and the current-steering switches. Certain aspects of the present disclosure provide circuitry dynamically implementing the stacked transistor architecture. For example, each stacked transistor may be turned off when a corresponding current-steering switch is opened such that the parasitic capacitance—at the node between the stacked transistor and the current-steering switch—does not discharge. Thus, parasitic capacitance may not have to be recharged each time the current-steering switch is closed, reducing distortion and improving DAC performance. Certain aspects provide improved DAC linearity, reduce leakage current, and reduce performance dependency on layout parasitic capacitances enabling use of different type of transistors for implementing the DAC.

Example Wireless Communications

Figure 1:
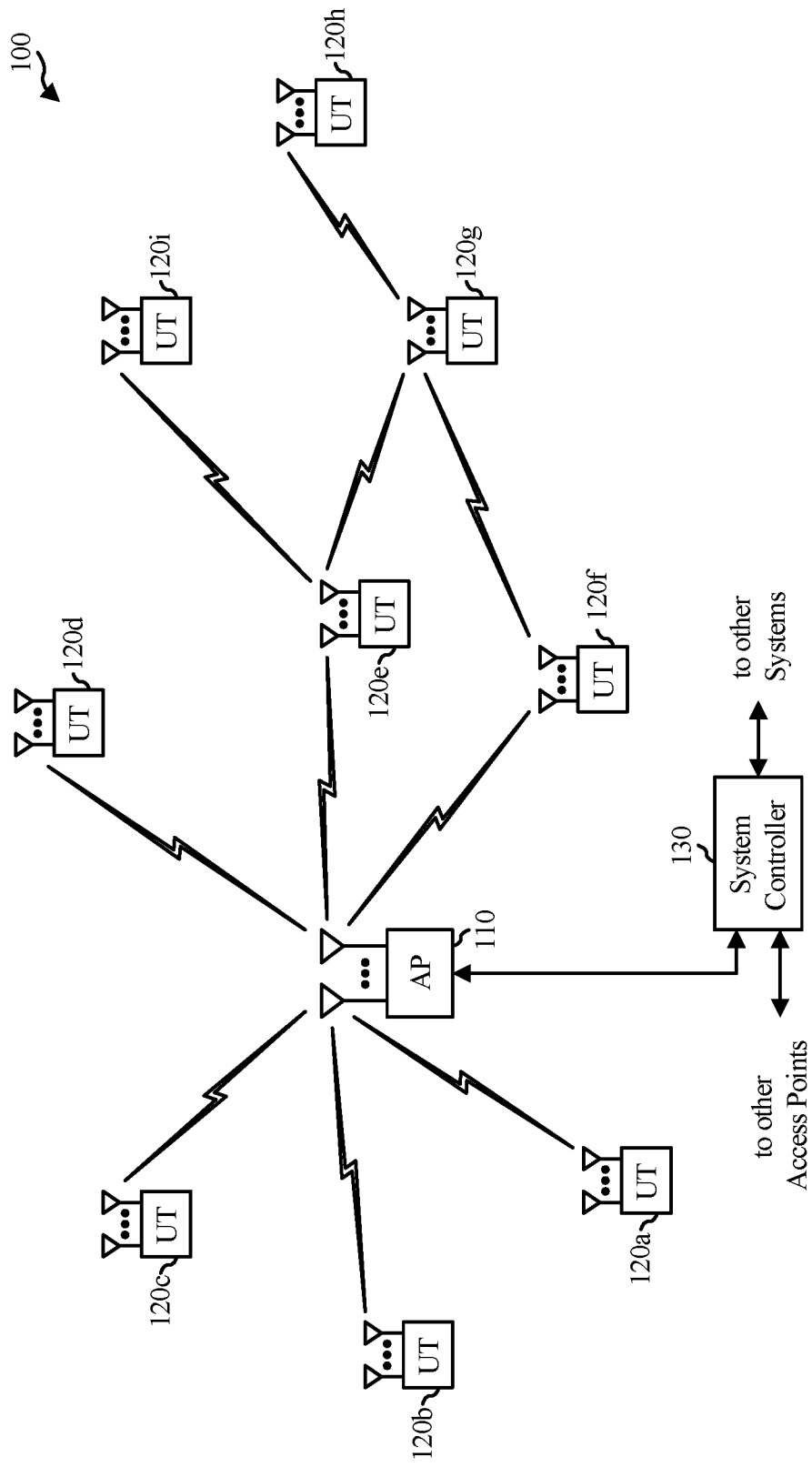
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), a next generation Node B (gNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In some aspects, the user terminal 120 or access point 110 may include a digital-to-analog converter (DAC) implemented with a dynamic stacked transistor architecture.

Figure 2:
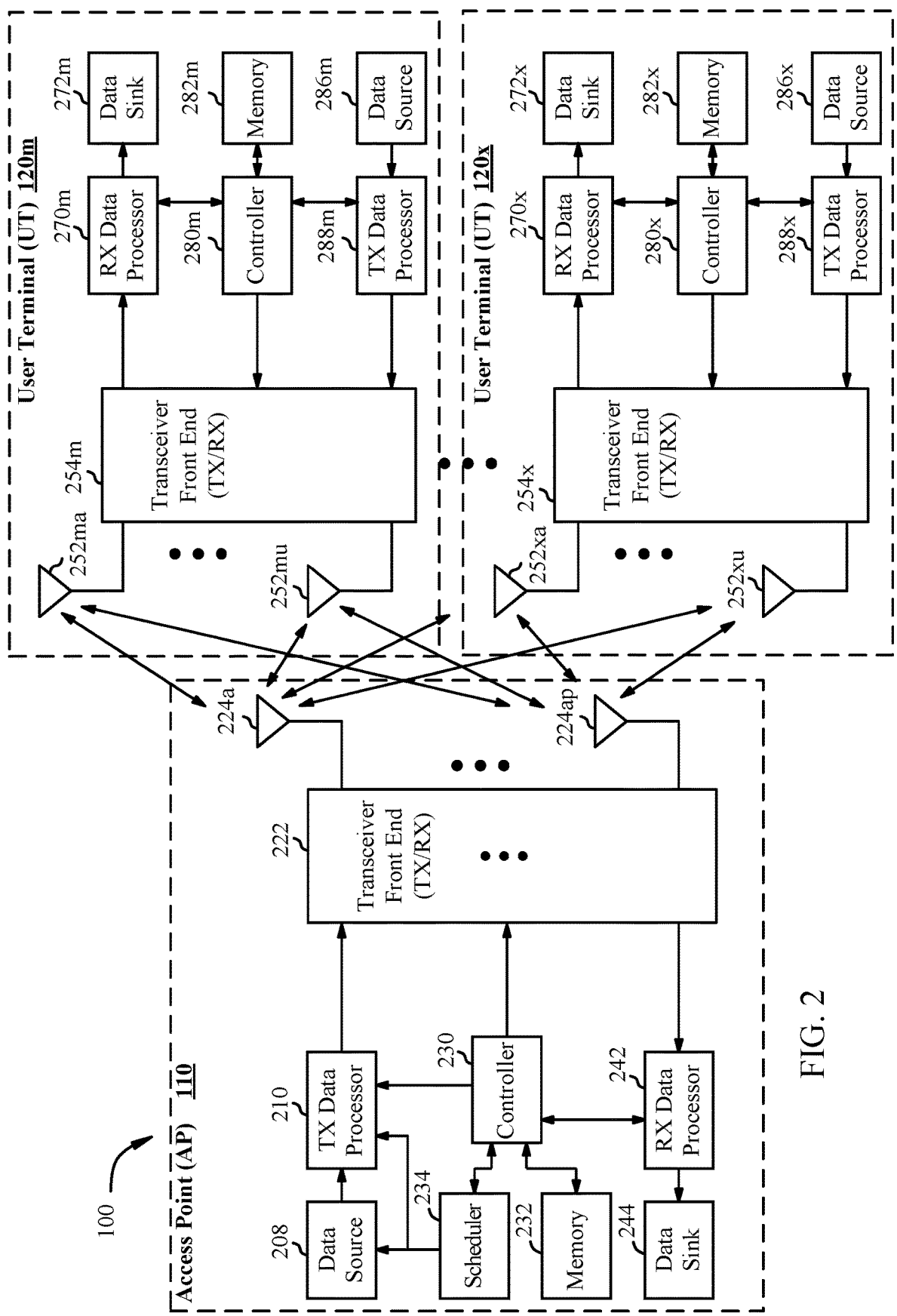
FIG. 2 is a block diagram of an example access point (AP) and example user terminals, in accordance with certain aspects of the present disclosure.

FIG. 2 shows a block diagram of access point 110 and two user terminals 120*m* and 120*x* in the wireless communications system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering, beamforming, or some other spatial processing technique may be used at the access point and/or user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254

(also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one or more of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal. In some aspects, the transceiver front end 254 or 222 may include a DAC implemented with a dynamic stacked transistor architecture.

Figure 3:
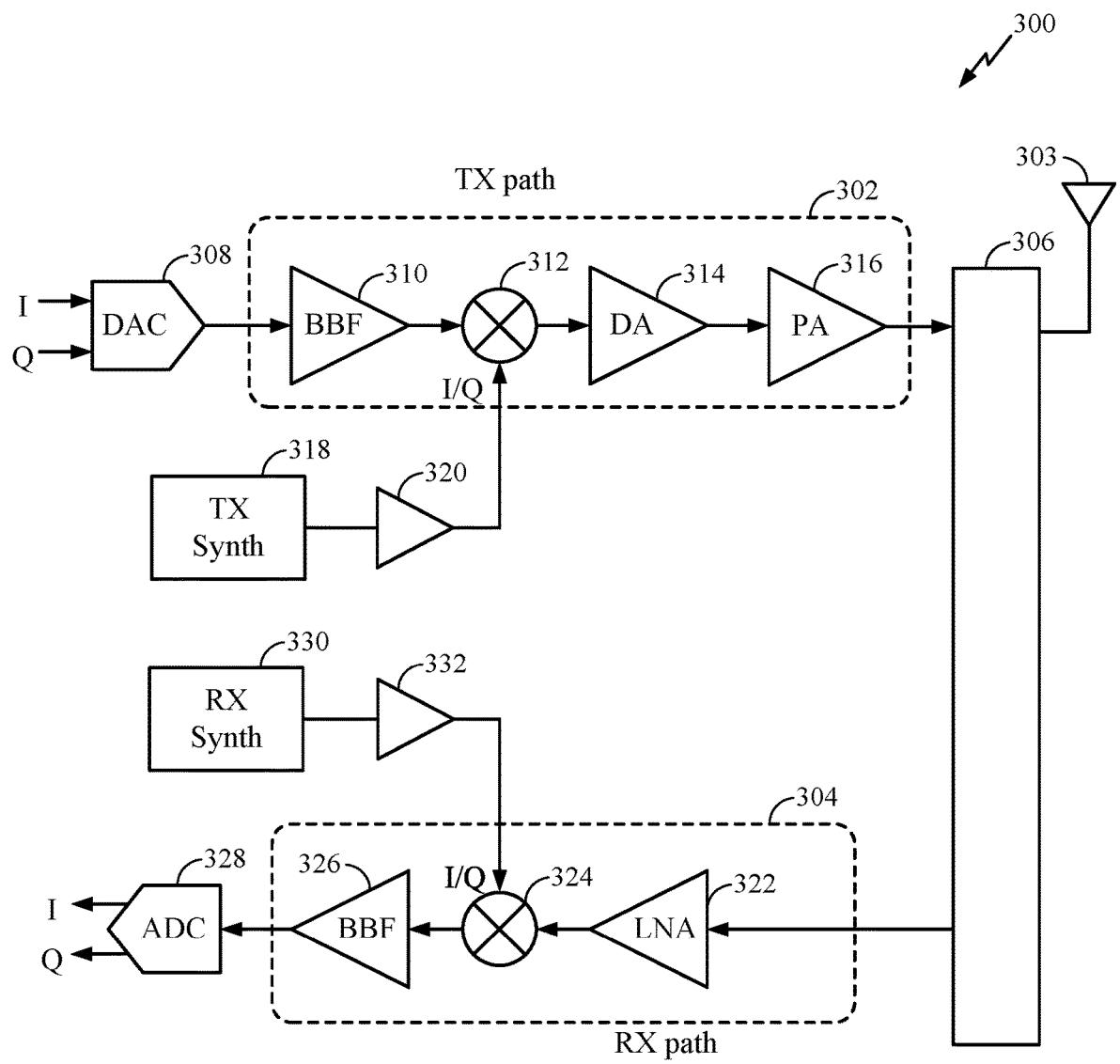
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC). In some cases, the PA 316 may be external to the RFIC.

The DAC 308 may be implemented by any of various suitable high-speed DAC topologies, such as a current-steering DAC. In some aspects, the DAC 308 may be implemented with a dynamic stacked transistor architecture, as described in more detail below.

The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency-conversion process produces the sum and difference frequencies of the LO frequency and the frequency of the baseband signal of interest. The sum and difference frequencies are referred to as the "beat frequencies." The beat frequencies are typically in the RF range, such that the signals output by the mixer 312 are typically RF signals, which may be amplified by the DA 314 and/or by the PA 316 before transmission by the antenna 303. While one mixer 312 is illustrated, several mixers may be used to upconvert the filtered baseband signals to one or more intermediate frequencies and to thereafter upconvert the intermediate frequency (IF) signals to a frequency for transmission.

The RX path 304 includes a low noise amplifier (LNA) 322, a mixer 324, and a baseband filter (BBF) 326. The LNA 322, the mixer 324, and the BBF 326 may be included in one or more radio frequency integrated circuits (RFICs), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

Certain transceivers may employ frequency synthesizers with a variable-frequency oscillator (e.g., a voltage-controlled oscillator (VCO) or a digitally controlled oscillator (DCO)) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide wireless communications as an example application in which certain aspects of the present disclosure may be implemented to facilitate understanding, certain aspects described herein may be used for digital-to-analog conversion in any of various other suitable systems (e.g., an audio system or other electronic system).

Current-steering digital-to-analog converters (DACs) are the architecture of choice for high performance digital-to-analog conversion in many wireless transmitters. Current-steering DACs offer versatility of design, allow high speed operation, and high performance. The current-steering DAC may be used in a transmit path due to the high speed associated with the DAC. The current-steering DAC may provide a positive output current (e.g., referred to herein as "Ipos" or "Ip") and a negative output current (e.g., referred to herein as "Ineg" or "Im"). In some cases, DAC performance (e.g., receiver band noise or harmonic distortion) may be dependent on the loading of the DAC (e.g., the input impedance of low-pass filter coupled to the output of the DAC). Some aspects of the present disclosure provide circuitry to reduce the dependency of the DAC specifications on the loading of the DAC.

Figure 4:
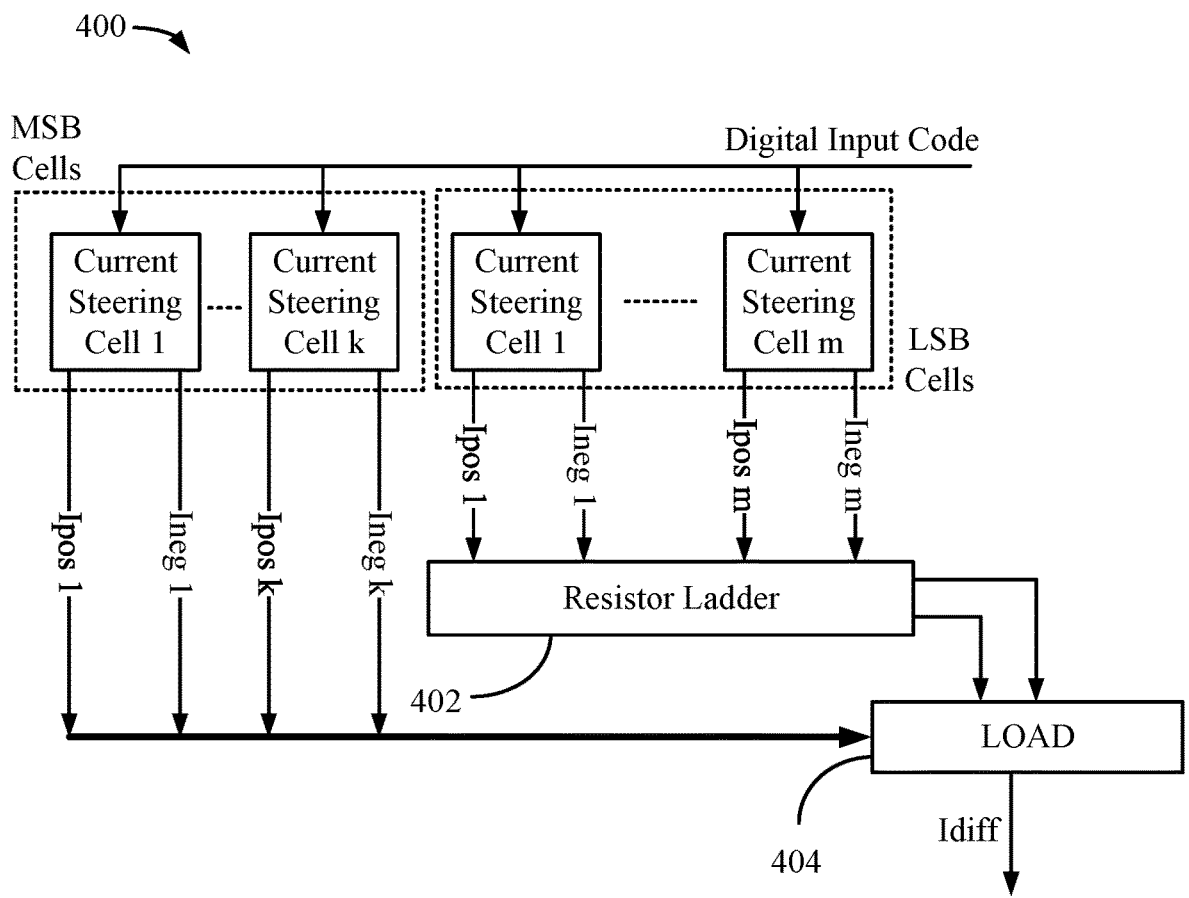
FIG. 4 illustrates an example current-steering digital-to-analog converter (DAC), in accordance with certain aspects of the present disclosure.

FIG. 4 illustrates an example current-steering DAC 400 (e.g., implemented as the DAC 308 of FIG. 3), in accordance with certain aspects of the present disclosure. Depending on a digital input code, each bit of the DAC 400 associated with a current-steering cell may source a positive current (e.g., Ipos 1 to Ipos k, k being an integer greater than 1, and Ipos 1 to Ipos m, m being an integer greater than 1) or a negative current (e.g., Ineg 1 to Ineg k, and Ineg 1 to Ineg m) to respective outputs depending on the logic level for a respective bit of the digital input code. In some aspects, the DAC 400 may include most significant bit (MSB) cells (e.g., including current-steering cells 1 to k) and least significant bit (LSB) cells (e.g., including current-steering cells 1 to m). Each of the current-steering cells may include switches to selectively provide a respective one of positive or negative currents. In some cases, the positive and negative currents from the LSB cells may be provided to a resistor ladder circuit 402 to implement different weights for the different LSB bits. The positive and negative currents are provided to a load 404 (e.g., BBF 310).

Figure 5:
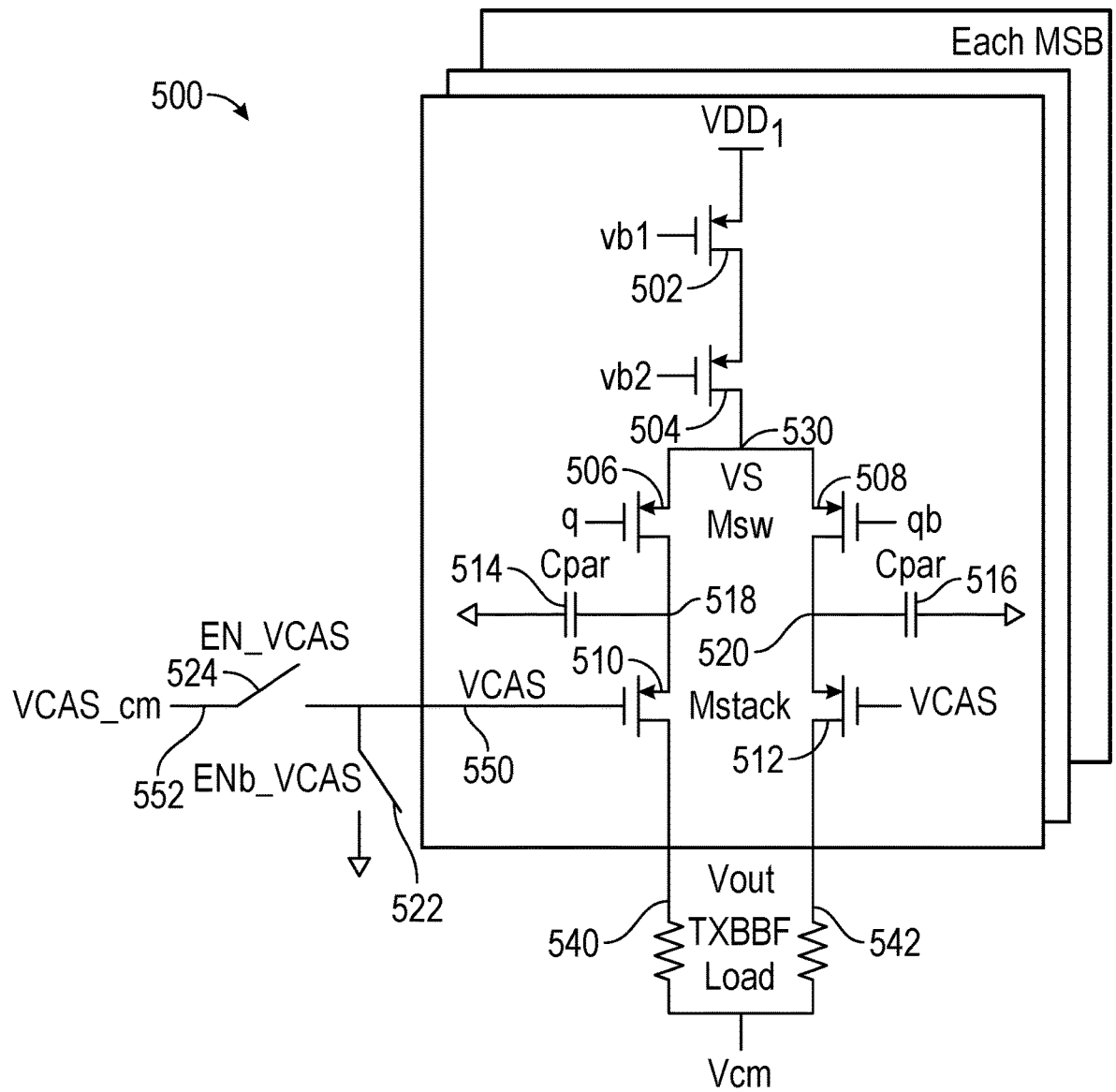
FIG. 5 illustrates an example current-steering DAC implemented with a stacked cascode architecture and enable circuitry therefor, in accordance with certain aspects of the present disclosure.

FIG. 5 illustrates example current-steering cells 500 (e.g., corresponding to the k MSB cells of FIG. 4). As shown, each current-steering cell includes a transistor 502 (e.g., a current source) connected in cascode with a transistor 504. The source of transistor 502 may be coupled to a voltage rail (e.g., $VDD_1$), and a drain of transistor 502 may be coupled to a source of transistor 504. The drain of transistor 504 is coupled to a current-steering node 530 of the current-steering cell. The current-steering node 530 may be coupled to current-steering switches (e.g., current-steering transistors 506, 508, labeled "Msw"). For example, the sources of transistors 506, 508 may be coupled to the current-steering node 530, as shown. The gate of transistor 506 may be driven by an input signal (q), and the gate of transistor 508 may be driven by a complementary input signal (qb).

A stacked cascode architecture may be used to isolate the DAC output (e.g., for providing output voltage Vout) from the DAC core via stacked switches (e.g., stacked transistors 510, 512, labeled "Mstack"), stacked in cascode with the current-steering switches (e.g., current-steering transistors 506, 508, respectively). In other words, without the stacked switches (also referred to herein as "stacked cascode devices"), variation in load impedance may have an impact on the signal at the current-steering node 530, degrading DAC performance. With the stacked switches, the DAC performance dependency on the load impedance is reduced. As shown, a drain of transistor 506 is coupled to a source of transistor 510, and a drain of transistor 508 is coupled to a source of transistor 512. The drain of transistor 510 may be coupled to a positive output node 540, and the drain of transistor 512 may be coupled to a negative output node 542. The output nodes 540, 542 may be coupled to a load (e.g., load 404), such as a baseband filter, represented in FIG. 5 by resistive elements tied to a common-mode voltage (Vcm).

In some aspects, switches 522, 524 may be used to enable or disable the stacked cascode devices. Switch 524 may be coupled between a common-mode (CM) cascode node 552 (e.g., providing a bias voltage labeled "VCAS-cm" for CM cascode voltage) and a cascode node 550 (e.g., labeled "VCAS" for cascode voltage). Switch 522 may be coupled between the cascode node 550 and a reference potential node (e.g., electrical ground). Switch 524 may be controlled by a cascode voltage enable signal (labeled "EN_VCAS"), whereas switch 522 may be controlled by a complementary cascode voltage enable signal (labeled "ENb_VCAS"). To "disable" the stacked cascode architecture, switch 522 may be closed, and switch 524 may be open, coupling the gates of transistors 510, 512 to the reference potential node (e.g., electrical ground) and turning on transistors 510, 512. In other words, in this scenario, the transistors 510, 512 are configured as closed switches, effectively shorting the drains of current-steering transistors 506, 508 to the output of the DAC.

To enable the stacked cascode architecture, switch 524 may be closed, and switch 522 may be opened, coupling the gates of transistors 510, 512 to the CM cascode node 552. Thus, the gates of transistors 510, 512 receive VCAS_cm (e.g., biasing the transistors 510, 512 in saturation) to reduce the output swing impact on the DAC performance.

As shown, a parasitic capacitor 514 (Cpar) may effectively exist between node 518 and the reference potential node, and a parasitic capacitor 516 (Cpar) may effectively exist between node 520 and the reference potential node. The parasitic capacitances (as well as capacitances associated with transistors 510, 512) degrade the performance of the DAC. In other words, when switching on and off the current-steering switches based on DAC input signaling, the parasitic capacitance is charged and discharged data-dependently, causing distortion.

Figure 6:
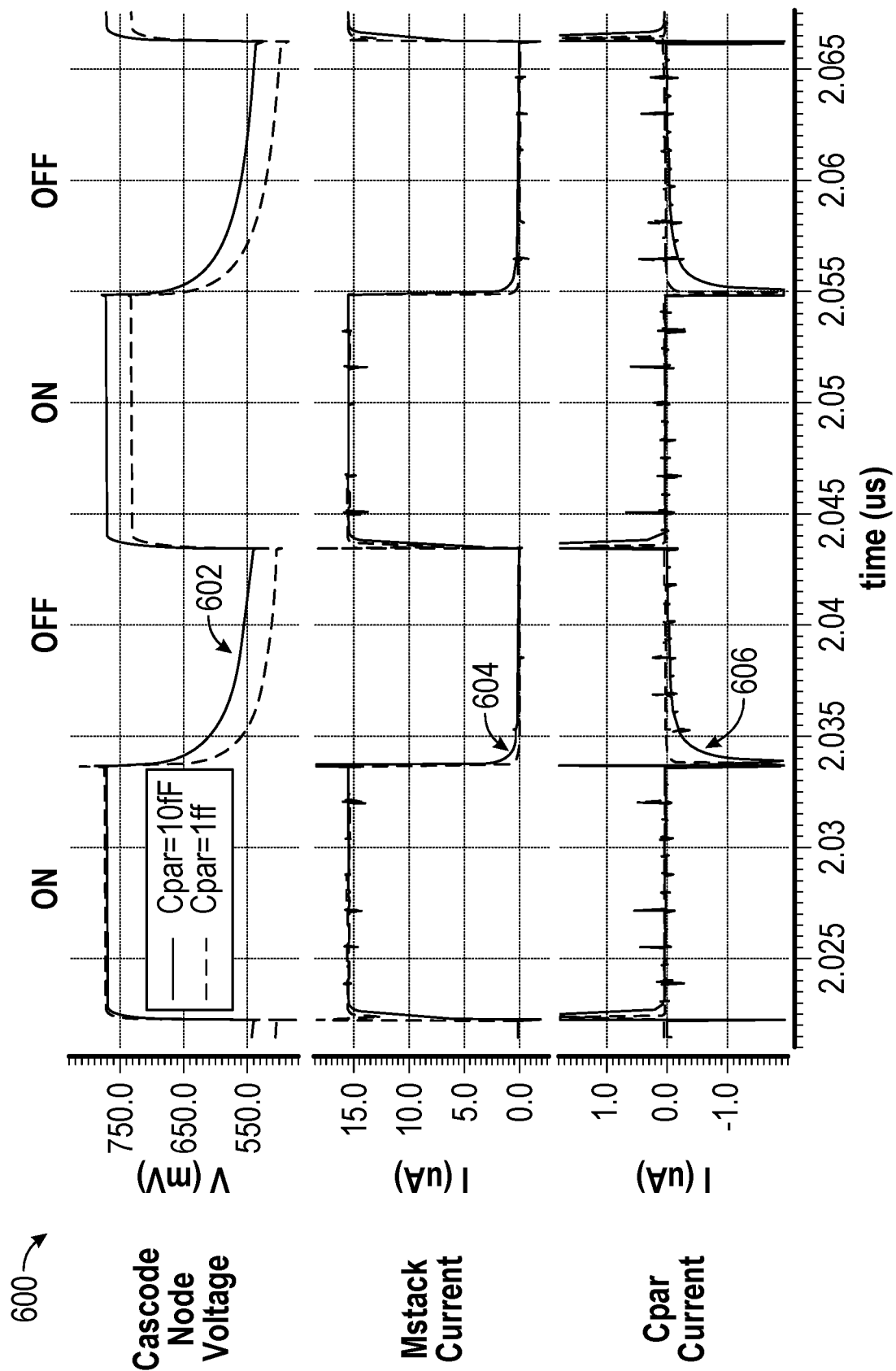
FIG. 6 is a graph illustrating a cascode node voltage, a stacked transistor current, and a parasitic capacitor current of an example current-steering DAC, in accordance with certain aspects of the present disclosure.

FIG. 6 is a graph 600 illustrating a cascode node voltage (e.g., voltage at node 518), stacked transistor current (e.g., source-to-drain current of transistor 510), and parasitic capacitance current (e.g., current across the parasitic capacitor 514), in accordance with certain aspects of the present disclosure. The graph 600 shows the cascode node voltage, stacked transistor current, and parasitic capacitance current for two different parasitic capacitance values (e.g., 10 femtofarad (fF) and 1 fF). As shown, when the current-steering transistor 506 is turned off, the parasitic capacitor 514 discharges (e.g., as shown by the gradual voltage decrease 602). The parasitic capacitance may cause current flow 604 (e.g., discharge current to the load) across transistor 510 for a period after the current-steering transistor 506 is turned off. Discharge current 606 across the parasitic capacitor is shown. Due to the parasitic capacitance being discharged when the corresponding current-steering switch is turned off, the same parasitic capacitance may be charged when the current-steering switch is turned on, causing distortion that degrades the performance of the DAC. Where the parasitic capacitance is 10 fF as shown in graph 600, the parasitic capacitance may consume more discharge current causing more distortion as compared to a case where the parasitic capacitance is 1 fF.

Figure 7:
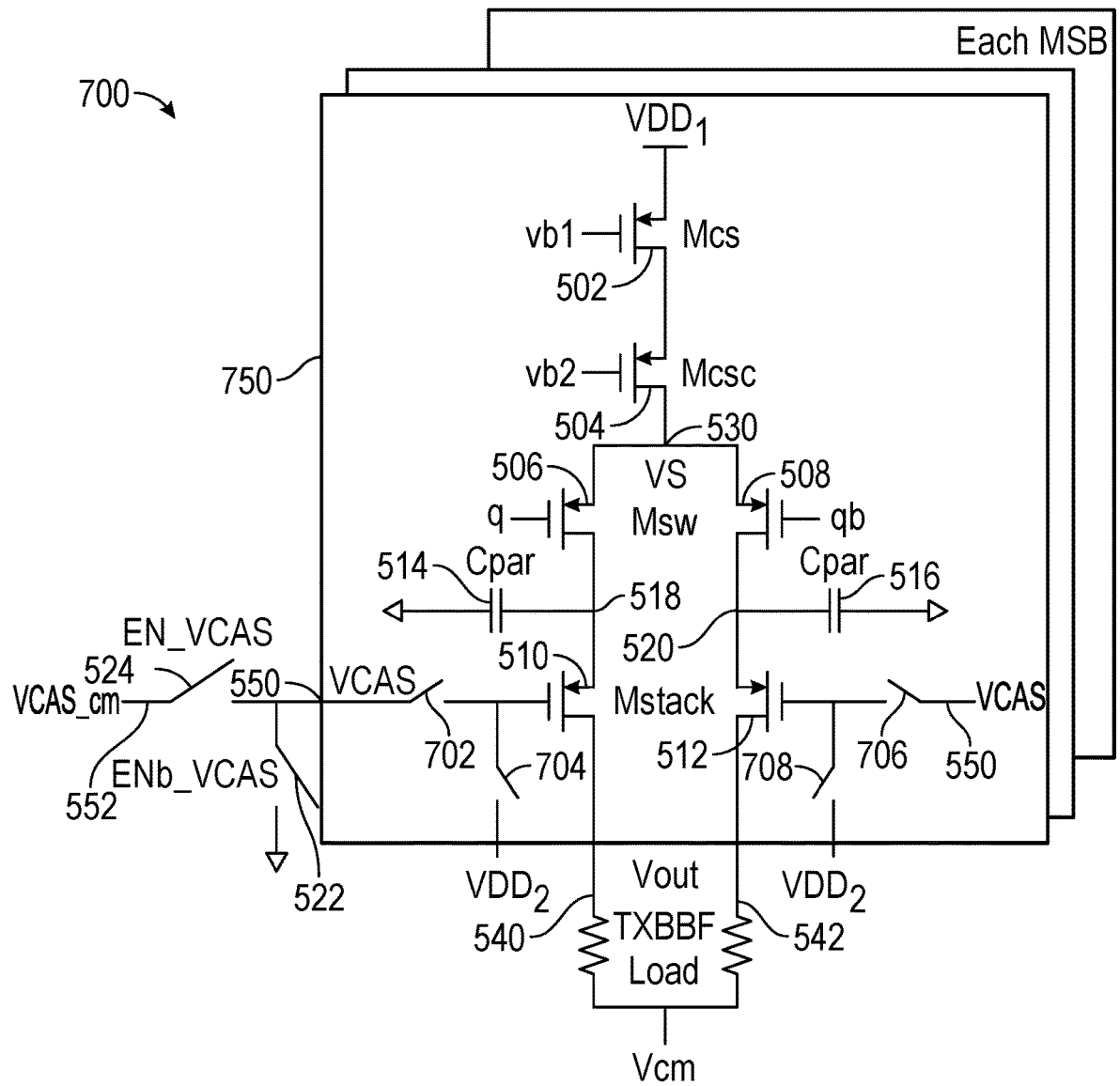
FIG. 7 illustrates example current-steering cells implemented with switch circuitry for activating or deactivating stacked transistors, in accordance with certain aspects of the present disclosure.

Certain aspects of the present disclosure provide switch circuitry that allows the parasitic capacitance of the current-steering cell to remain charged when transitioning between on and off states of the current-steering transistors, as described in more detail with respect to FIG. 7.

FIG. 7 illustrates example current-steering cells 700 (e.g., corresponding to the MSB cells of FIG. 4) implemented with switch circuitry for activating or deactivating stacked transistors, in accordance with certain aspects of the present disclosure. The current-steering cells 700 are implemented with a dynamic stacked cascode architecture. In other words, the current steering cells include stacked transistors 510, 512 where the signal used to drive the gates of transistors 510, 512 may be dynamically changed.

As shown, each current-steering cell (e.g. current-steering cell 750) may include a switch 702 coupled between the gate of transistor 510 and the cascode node 550, and a switch 704 coupled between the gate of transistor 510 and a voltage rail ($VDD_2$). The voltage rails $VDD_1$ and $VDD_2$ may be the same or different voltage rails. Each current-steering cell may also include a switch 706 coupled between the gate of transistor 512 and the cascode node 550, and a switch 708 coupled between the gate of transistor 512 and $VDD_2$.

In some aspects, the switches 702, 704, 706, 708 may be low voltage threshold (LVT) p-channel metal-oxide-semiconductor (PMOS) transistors. Switches 702, 708 may be closed when the input signal (q) is logic low (e.g., current-steering transistor 506 is turned on), and switches 704, 706 may be closed when the complementary input signal (qb) is logic low (e.g., when current-steering transistor 508 is turned on). When the input signal is logic low, the gate of transistor 510 is coupled to the cascode node 550, and the gate of transistor 512 is coupled to $VDD_2$. When the complementary input signal is logic low, the gate of transistor 512 is coupled to the cascode node 550, and the gate of transistor 510 is coupled to $VDD_2$. In effect, switches 702, 704, 706, 708 turn off the stacked transistors 510, 512 when the current-steering transistors 506, 508, respectively, are turned off, so that the parasitic capacitances do not discharge to the load, as described in more detail with respect to FIG. 8.

Figure 8:
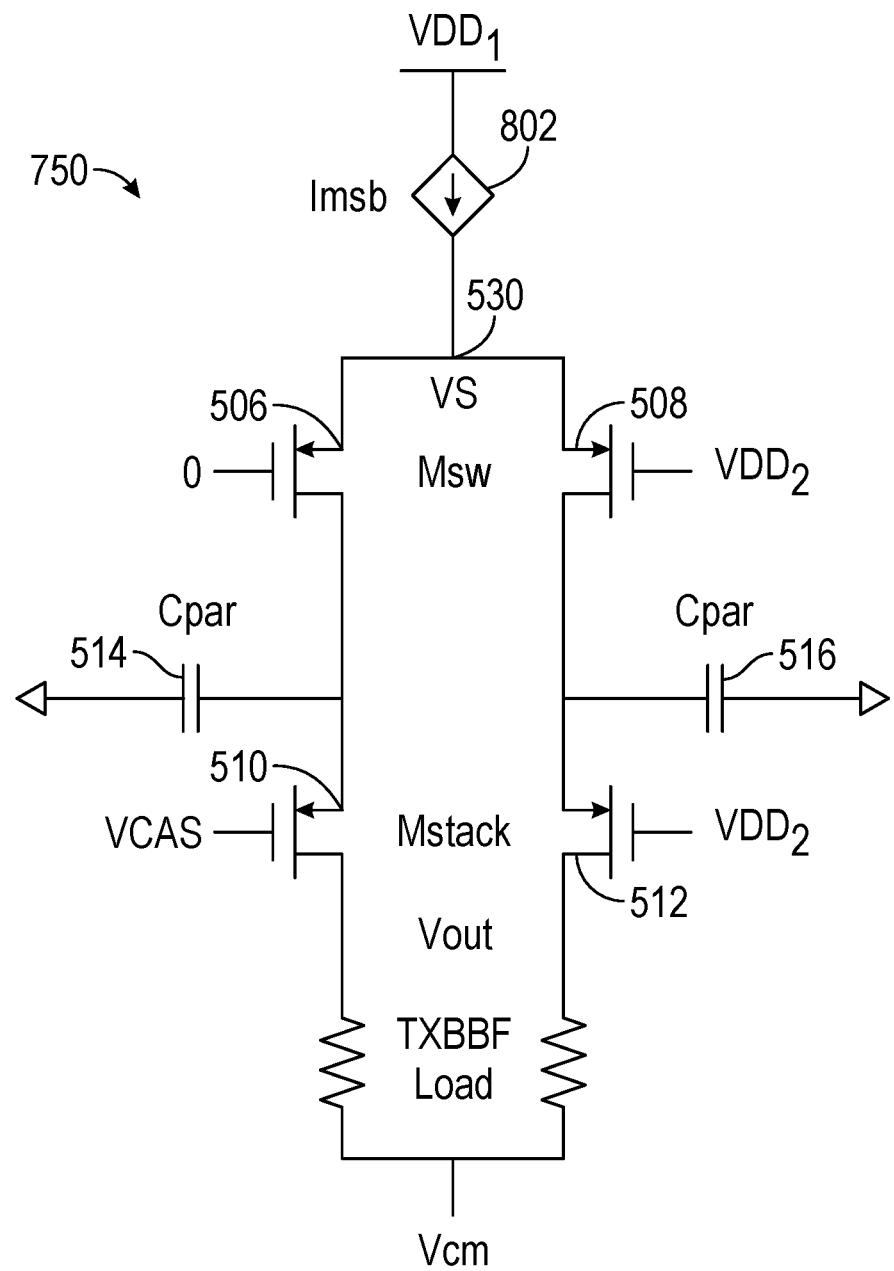
FIG. 8 illustrates a current-steering cell receiving a logic low input signal, in accordance with certain aspects of the present disclosure.

FIG. 8 illustrates the current-steering cell 750 receiving an input signal (q) that is logic low and a complementary input signal (qb) that is logic high, in accordance with certain aspects of the present disclosure. A current source 802 may provide an MSB current (lmsb) to current-steering node 530. As shown, the logic low input signal may be received at the gate of transistor 506, and $VDD_2$ may be received at the gate of transistor 508. Thus, transistor 506 may be turned on, and transistor 508 is turned off. Moreover, the gate of transistor 510 receives VCAS, and the gate of transistor 512 receives $VDD_2$. Thus, while the current-steering transistor 508 is turned off, the transistor 512 is also turned off (e.g., configured as an open switch). As a result, the parasitic capacitor 516 is not discharged through transistor 512 to the load. The transistor 510 is biased using VCAS (or VCAS_cm) to isolate the DAC core from the load when the transistor 506 is turned on. Similarly, when current-steering transistor 506 is turned off, transistor 510 is turned off so that the parasitic capacitor 514 is not discharged to the load through transistor 510.

In effect, transistors 506, 510 work as a single stacked transistor (e.g., transistors 506, 510 are turned off together), and transistors 508, 512 work as a single stacked transistor (e.g., transistors 508, 512 are turned off together). Therefore, the parasitic capacitances are not charged and discharged during switching operations of the current-steering cell. Turning off transistors 510, 512 as described also reduces off-branch leakage current. In other words, if $VDD_2$ is at a voltage that allows some leakage current across transistor 508 when transistor 508 should be turned off (e.g., configured as an open switch), having transistor 512 connected in cascode with transistor 508 and also driven by $VDD_2$ reduces the leakage current to the load.

Figure 9:
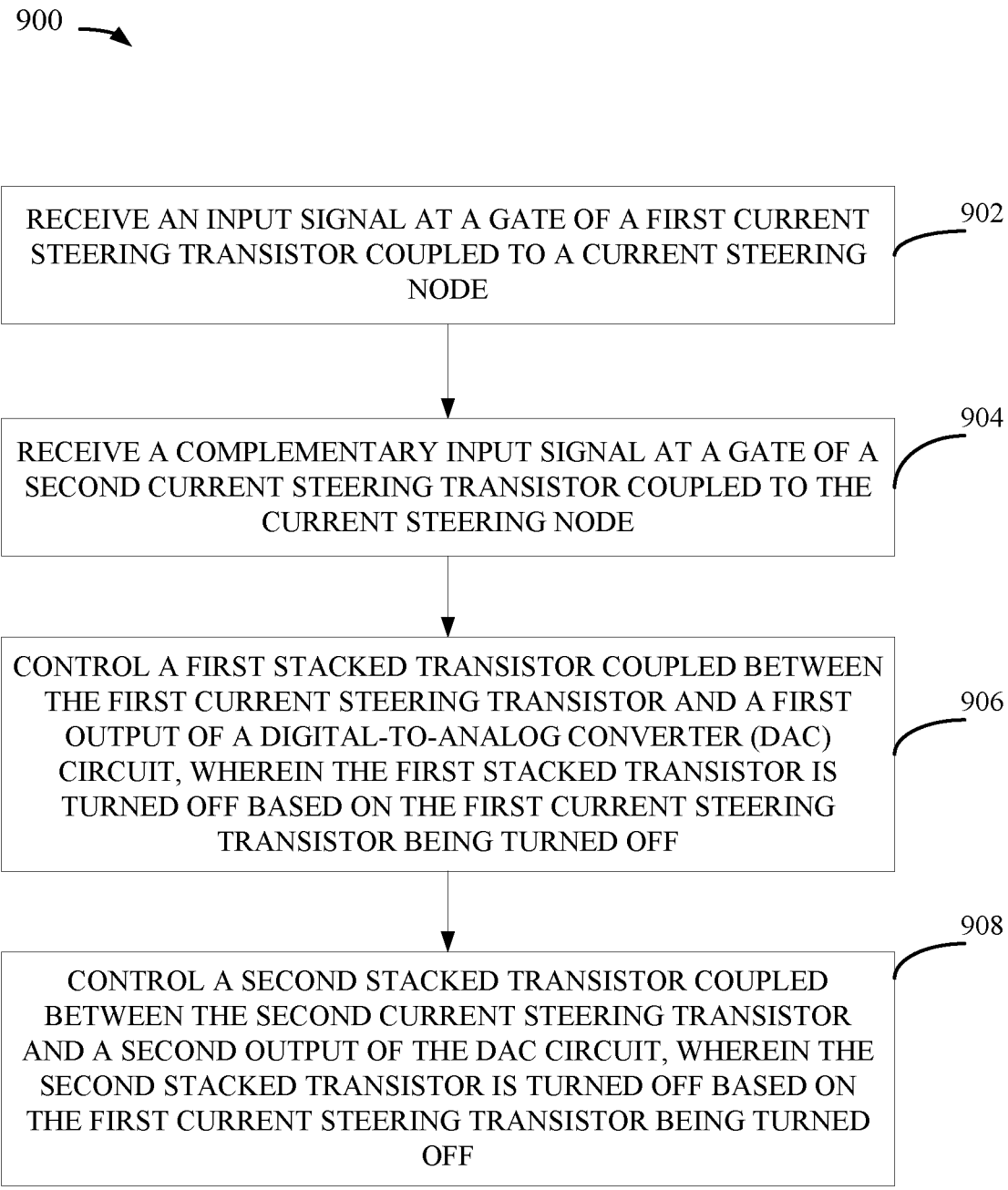
FIG. 9 is a flow diagram depicting example operations for digital-to-analog conversion, in accordance with certain aspects of the present disclosure.

FIG. 9 is a flow diagram depicting example operations 900 for digital-to-analog conversion, in accordance with certain aspects of the present disclosure. For example, the operations 900 may be performed by a DAC circuit, such as a DAC including the current-steering cells 700.

The operations 900 begin, at block 902, with the DAC circuit receiving an input signal at a gate of a first current-steering transistor (e.g., transistor 506 of FIG. 7) coupled to a current-steering node (e.g., current-steering node 530). At block 904, the DAC circuit receives a complementary input signal at a gate of a second current-steering transistor (e.g., current-steering transistor 508) coupled to the current-steering node.

At block 906, the DAC circuit controls a first stacked transistor (e.g., stacked transistor 510) coupled between the first current-steering transistor and a first output (e.g., output node 540) of the DAC circuit. The first stacked transistor may be turned off based on the first current-steering transistor being turned off.

At block 908, the DAC circuit controls a second stacked transistor (e.g., transistor 512) coupled between the second current-steering transistor and a second output of the DAC circuit. The second stacked transistor may be turned off based on the first current-steering transistor being turned off. Each of the first current-steering transistor, the second current-steering transistor, the first stacked transistor, and the second stacked transistor may comprise a PMOS transistor.

In some aspects, controlling the first stacked transistor includes turning off the first stacked transistor by coupling a gate of the first stacked transistor to a voltage rail via a first switch (e.g., switch 704). Controlling the second stacked transistor may include turning off the second stacked transistor by coupling a gate of the second stacked transistor to the voltage rail via a second switch (e.g., switch 708).

In some aspects, controlling the first stacked transistor may include providing a bias voltage (e.g., VCAS or VCAS_cm) to a gate of the first stacked transistor based on the first current-steering transistor being turned on. Controlling the second stacked transistor may include providing the bias voltage to a gate of the second stacked transistor based on the second current-steering transistor being turned on. In some aspects, controlling the first stacked transistor may include configuring the first stacked transistor in a saturation region via the bias voltage. Moreover, controlling the second stacked transistor may include configuring the second stacked transistor in a saturation region via the bias voltage.

Example Aspects

Aspect 1: A digital-to-analog converter (DAC) circuit, comprising: a first current-steering transistor coupled to a current-steering node; a second current-steering transistor coupled to the current-steering node; a first stacked transistor coupled between the first current-steering transistor and a first output of the DAC circuit; a first switch coupled between a gate of the first stacked transistor and a bias voltage node; a second switch coupled between the gate of the first stacked transistor and a voltage rail; a second stacked transistor coupled between the second current-steering transistor and a second output of the DAC circuit; a third switch coupled between a gate of the second stacked transistor and the bias voltage node; and a fourth switch coupled between the gate of the second stacked transistor and the voltage rail.

Aspect 2: The DAC circuit of Aspect 1, wherein, based on the first current-steering transistor being turned off and the second current-steering transistor being turned on: the first switch is configured to be opened; the second switch is configured to be closed; the third switch is configured to be closed; and the fourth switch is configured to be opened.

Aspect 3: The DAC circuit of Aspect 1 or 2, wherein, based on the first current-steering transistor being turned on and the second current-steering transistor being turned off: the first switch is configured to be closed; the second switch is configured to be opened; the third switch is configured to be opened; and the fourth switch is configured to be closed.

Aspect 4: The DAC circuit according to any of Aspects 1-3, wherein each of the first current-steering transistor, the second current-steering transistor, the first stacked transistor, and the second stacked transistor comprises a p-channel metal-oxide-semiconductor (PMOS) transistor and wherein each of the first switch, the second switch, the third switch, and the fourth switch is implemented by a low voltage threshold (LVT) PMOS transistor.

Aspect 5: The DAC circuit according to any of Aspects 1-4, wherein: gates of the first current-steering transistor and the second current-steering transistor are configured to receive input signaling for the DAC circuit; and the first switch, the second switch, the third switch, and the fourth switch are configured to be controlled based on the input signaling.

Aspect 6: The DAC circuit according to any of Aspects 1-5, further comprising a current source coupled to the current-steering node.

Aspect 7: The DAC circuit according to any of Aspects 1-6, wherein the first output and the second output of the DAC circuit are configured for coupling to a baseband filter (BBF).

Aspect 8: A digital-to-analog converter (DAC) circuit, comprising: a first current-steering transistor coupled to a current-steering node; a second current-steering transistor coupled to the current-steering node; a first stacked transistor coupled between the first current-steering transistor and a first output of the DAC circuit, wherein the first stacked transistor is configured to be turned off based on the first current-steering transistor being turned off; and a second stacked transistor coupled between the second current-steering transistor and a second output of the DAC circuit, wherein the second stacked transistor is configured to be turned off based on the first current-steering transistor being turned off.

Aspect 9: The DAC circuit of Aspect 8, wherein: the first stacked transistor is configured to be turned off by coupling a gate of the first stacked transistor to a voltage rail via a first switch; and the second stacked transistor is configured to be turned off by coupling a gate of the second stacked transistor to the voltage rail via a second switch.

Aspect 10: The DAC circuit of Aspect 9, wherein: the first stacked transistor is configured to receive a bias voltage based on the first current-steering transistor being turned on; and the second stacked transistor is configured to receive the bias voltage based on the second current-steering transistor being turned on.

Aspect 11: The DAC circuit according to any of Aspects 8-10, wherein: the first stacked transistor is configured to receive a bias voltage based on the first current-steering transistor being turned on; and the second stacked transistor is configured to receive the bias voltage based on the second current-steering transistor being turned on.

Aspect 12: The DAC circuit of Aspect 11, wherein: the first stacked transistor is configured in a saturation region based on receiving the bias voltage; and the second stacked transistor is configured in a saturation region based on receiving the bias voltage.

Aspect 13: The DAC circuit according to any of Aspects 8-12, wherein each of the first current-steering transistor, the second current-steering transistor, the first stacked transistor, and the second stacked transistor comprises a p-channel metal-oxide-semiconductor (PMOS) transistor.

Aspect 14: The DAC circuit according to any of Aspects 8-13, wherein: gates of the first current-steering transistor and the second current-steering transistor are configured to receive input signaling for the DAC circuit; and gates of the first stacked transistor and the second stacked transistor are selectively coupled to a voltage rail or a bias voltage node based on the input signaling.

Aspect 15: The DAC circuit according to any of Aspects 8-14, further comprising a current source coupled to the current-steering node.

Aspect 16: The DAC circuit according to any of Aspects 8-15, wherein the first output and the second output of the DAC circuit are configured for coupling to a baseband filter (BBF).

Aspect 17: A method for digital-to-analog conversion, comprising: receiving an input signal at a gate of a first current-steering transistor coupled to a current-steering node; receiving a complementary input signal at a gate of a second current-steering transistor coupled to the current-steering node; controlling a first stacked transistor coupled between the first current-steering transistor and a first output of a digital-to-analog converter (DAC) circuit, wherein the first stacked transistor is turned off based on the first current-steering transistor being turned off; and controlling a second stacked transistor coupled between the second current-steering transistor and a second output of the DAC circuit, wherein the second stacked transistor is turned off based on the first current-steering transistor being turned off.

Aspect 18: The method of Aspect 17, wherein: controlling the first stacked transistor includes turning off the first stacked transistor by coupling a gate of the first stacked transistor to a voltage rail via a first switch; and controlling the second stacked transistor includes turning off the second stacked transistor by coupling a gate of the second stacked transistor to the voltage rail via a second switch.

Aspect 19: The method of Aspect 17 or 18, wherein: controlling the first stacked transistor includes providing a bias voltage to a gate of the first stacked transistor based on the first current-steering transistor being turned on; and controlling the second stacked transistor includes providing the bias voltage to a gate of the second stacked transistor based on the second current-steering transistor being turned on.

Aspect 20: The method of Aspect 19, wherein: controlling the first stacked transistor includes configuring the first stacked transistor in a saturation region via the bias voltage; and controlling the second stacked transistor includes configuring the second stacked transistor in a saturation region via the bias voltage.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage, or mode of operation. The term "coupled" is used herein to refer to the direct or indirect coupling between two objects. For example, if object A physically touches object B and object B touches object C, then objects A and C may still be considered coupled to one another-even if objects A and C do not directly physically touch each other. For instance, a first object may be coupled to a second object even though the first object is never directly physically in contact with the second object. The terms "circuit" and "circuitry" are used broadly and intended to include both hardware implementations of electrical devices and conductors that, when connected and configured, enable the performance of the functions described in the present disclosure, without limitation as to the type of electronic circuits.

The apparatus and methods described in the detailed description are illustrated in the accompanying drawings by various blocks, modules, components, circuits, steps, processes, algorithms, etc. (collectively referred to as "elements"). These elements may be implemented using hardware, for example.

One or more of the components, steps, features, and/or functions illustrated herein may be rearranged and/or combined into a single component, step, feature, or function or embodied in several components, steps, or functions. Additional elements, components, steps, and/or functions may also be added without departing from features disclosed herein. The apparatus, devices, and/or components illustrated herein may be configured to perform one or more of the methods, features, or steps described herein.

It is to be understood that the specific order or hierarchy of steps in the methods disclosed is an illustration of exemplary processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover at least: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c). All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." For example, means for determining may a digital controller such as digital controller 510. Means for generating one or more currents may include a calibration DAC, such as the calibration DAC 802.

It is to be understood that the claims are not limited to the precise configuration and components illustrated above. Various modifications, changes and variations may be made in the arrangement, operation and details of the methods and apparatus described above without departing from the scope of the claims.

The invention claimed is:

1. A digital-to-analog converter (DAC) circuit, comprising:
 a first current-steering transistor coupled to a current-steering node;
 a second current-steering transistor coupled to the current-steering node;
 a first stacked transistor coupled between the first current-steering transistor and a first output of the DAC circuit;
 a first switch coupled between a gate of the first stacked transistor and a bias voltage node;
 a second switch coupled between the gate of the first stacked transistor and a voltage rail;
 a second stacked transistor coupled between the second current-steering transistor and a second output of the DAC circuit;
 a third switch coupled between a gate of the second stacked transistor and the bias voltage node; and
 a fourth switch coupled between the gate of the second stacked transistor and the voltage rail.

2. The DAC circuit of claim 1, wherein, based on the first current-steering transistor being turned off and the second current-steering transistor being turned on:
 the first switch is configured to be opened;
 the second switch is configured to be closed;
 the third switch is configured to be closed; and
 the fourth switch is configured to be opened.

3. The DAC circuit of claim 1, wherein, based on the first current-steering transistor being turned on and the second current-steering transistor being turned off:
 the first switch is configured to be closed;
 the second switch is configured to be opened;
 the third switch is configured to be opened; and
 the fourth switch is configured to be closed.

4. The DAC circuit of claim 1, wherein each of the first current-steering transistor, the second current-steering transistor, the first stacked transistor, and the second stacked transistor comprises a p-channel metal-oxide-semiconductor (PMOS) transistor and wherein each of the first switch, the second switch, the third switch, and the fourth switch is implemented by a low voltage threshold (LVT) PMOS transistor.

5. The DAC circuit of claim 1, wherein:
 gates of the first current-steering transistor and the second current-steering transistor are configured to receive input signaling for the DAC circuit; and
 the first switch, the second switch, the third switch, and the fourth switch are configured to be controlled based on the input signaling.

6. The DAC circuit of claim 1, further comprising a current source coupled to the current-steering node.

7. The DAC circuit of claim 1, wherein the first output and the second output of the DAC circuit are configured for coupling to a baseband filter (BBF).

8. A digital-to-analog converter (DAC) circuit, comprising:
a first current-steering transistor coupled to a current-steering node;
a second current-steering transistor coupled to the current-steering node;
a first stacked transistor coupled between the first current-steering transistor and a first output of the DAC circuit, wherein the first stacked transistor is configured to be turned off based on the first current-steering transistor being turned off; and
a second stacked transistor coupled between the second current-steering transistor and a second output of the DAC circuit, wherein the second stacked transistor is configured to be turned off based on the first current-steering transistor being turned off.

9. The DAC circuit of claim 8, wherein:
the first stacked transistor is configured to be turned off by coupling a gate of the first stacked transistor to a voltage rail via a first switch; and
the second stacked transistor is configured to be turned off by coupling a gate of the second stacked transistor to the voltage rail via a second switch.

10. The DAC circuit of claim 9, wherein:
the first stacked transistor is configured to receive a bias voltage based on the first current-steering transistor being turned on; and
the second stacked transistor is configured to receive the bias voltage based on the second current-steering transistor being turned on.

11. The DAC circuit of claim 8, wherein:
the first stacked transistor is configured to receive a bias voltage based on the first current-steering transistor being turned on; and
the second stacked transistor is configured to receive the bias voltage based on the second current-steering transistor being turned on.

12. The DAC circuit of claim 11, wherein:
the first stacked transistor is configured in a saturation region based on receiving the bias voltage; and
the second stacked transistor is configured in a saturation region based on receiving the bias voltage.

13. The DAC circuit of claim 8, wherein each of the first current-steering transistor, the second current-steering transistor, the first stacked transistor, and the second stacked transistor comprises a p-channel metal-oxide-semiconductor (PMOS) transistor.

14. The DAC circuit of claim 8, wherein:
gates of the first current-steering transistor and the second current-steering transistor are configured to receive input signaling for the DAC circuit; and
gates of the first stacked transistor and the second stacked transistor are selectively coupled to a voltage rail or a bias voltage node based on the input signaling.

15. The DAC circuit of claim 8, further comprising a current source coupled to the current-steering node.

16. The DAC circuit of claim 8, wherein the first output and the second output of the DAC circuit are configured for coupling to a baseband filter (BBF).

17. A method for digital-to-analog conversion, comprising:
receiving an input signal at a gate of a first current-steering transistor coupled to a current-steering node;
receiving a complementary input signal at a gate of a second current-steering transistor coupled to the current-steering node;
controlling a first stacked transistor coupled between the first current-steering transistor and a first output of a digital-to-analog converter (DAC) circuit, wherein the first stacked transistor is turned off based on the first current-steering transistor being turned off; and
controlling a second stacked transistor coupled between the second current-steering transistor and a second output of the DAC circuit, wherein the second stacked transistor is turned off based on the first current-steering transistor being turned off.

18. The method of claim 17, wherein:
controlling the first stacked transistor includes turning off the first stacked transistor by coupling a gate of the first stacked transistor to a voltage rail via a first switch; and
controlling the second stacked transistor includes turning off the second stacked transistor by coupling a gate of the second stacked transistor to the voltage rail via a second switch.

19. The method of claim 17, wherein:
controlling the first stacked transistor includes providing a bias voltage to a gate of the first stacked transistor based on the first current-steering transistor being turned on; and
controlling the second stacked transistor includes providing the bias voltage to a gate of the second stacked transistor based on the second current-steering transistor being turned on.

20. The method of claim 19, wherein:
controlling the first stacked transistor includes configuring the first stacked transistor in a saturation region via the bias voltage; and
controlling the second stacked transistor includes configuring the second stacked transistor in a saturation region via the bias voltage.

* * * * *